(12) United States Patent
Duan et al.

(10) Patent No.: US 11,996,391 B2
(45) Date of Patent: *May 28, 2024

(54) SEMICONDUCTOR STRUCTURE

(71) Applicant: MediaTek Singapore Pte. Ltd., Singapore (SG)

(72) Inventors: Zhigang Duan, Singapore (SG); Jinghao Chen, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/057,885

(22) Filed: Nov. 22, 2022

(65) Prior Publication Data

US 2023/0078884 A1   Mar. 16, 2023

Related U.S. Application Data

(63) Continuation of application No. 17/399,221, filed on Aug. 11, 2021, now Pat. No. 11,538,793.

(Continued)

(51) Int. Cl.
*H01L 21/00* (2006.01)
*H01L 23/522* (2006.01)
(Continued)

(52) U.S. Cl.
CPC ...... *H01L 25/0657* (2013.01); *H01L 23/5222* (2013.01); *H01L 28/60* (2013.01)

(58) Field of Classification Search
CPC .. H01L 25/0657; H01L 23/5222; H01L 28/60
See application file for complete search history.

(56) References Cited

U.S. PATENT DOCUMENTS

| 1,090,317 | A | 3/1914 | Lindstrom |
| 10,937,858 | B2 * | 3/2021 | Chen ............. H01L 28/60 |

(Continued)

FOREIGN PATENT DOCUMENTS

| CN | 113380772 A | * | 9/2021 |
| CN | 113380772 A1 | | 9/2021 |

(Continued)

OTHER PUBLICATIONS

Chinese language office action dated Aug. 2, 2022, issued in application No. TW 110133969.

*Primary Examiner* — Laura M Menz
(74) *Attorney, Agent, or Firm* — McClure, Qualey & Rodack, LLP

(57) ABSTRACT

A semiconductor structure includes a first substrate having a wiring structure, a first semiconductor die disposed on the first substrate, and a multi-terminal capacitor structure disposed on the first substrate. The multi-terminal capacitor includes a second substrate, an insulating layer disposed over the second substrate, a first multi-terminal capacitor disposed over the insulating layer and electrically coupled to the first semiconductor die through the wiring structure, and a second multi-terminal capacitor disposed over the insulating layer and electrically coupled to the second semiconductor die through the wiring structure, wherein the first multi-terminal capacitor and the second multi-terminal capacitor are electrically isolated from the second substrate.

20 Claims, 5 Drawing Sheets

Related U.S. Application Data

(60) Provisional application No. 63/105,922, filed on Oct. 27, 2020.

(51) Int. Cl.
 *H01L 25/065* (2023.01)
 *H01L 49/02* (2006.01)

(56) References Cited

U.S. PATENT DOCUMENTS

| | | | | |
|---|---|---|---|---|
| 11,410,932 | B2* | 8/2022 | Tseng | H01G 4/228 |
| 11,538,793 | B2* | 12/2022 | Duan | H01L 25/0657 |
| 2014/0091428 | A1* | 4/2014 | Hossain | H05K 1/181 |
| | | | | 257/532 |
| 2018/0130781 | A1* | 5/2018 | Kang | H01L 25/18 |
| 2019/0139883 | A1* | 5/2019 | Gandhi | H01L 23/50 |
| 2019/0333908 | A1* | 10/2019 | Kang | H01L 25/0652 |
| 2020/0185323 | A1* | 6/2020 | Gandhi | H01G 4/40 |
| 2020/0251552 | A1* | 8/2020 | Chen | H01L 23/5223 |
| 2021/0118794 | A1* | 4/2021 | Ding | H01L 28/60 |
| 2021/0305164 | A1* | 9/2021 | Tseng | H01G 4/33 |
| 2021/0327864 | A1* | 10/2021 | Buot | H01L 23/50 |
| 2021/0343684 | A1* | 11/2021 | Kim | H01L 24/13 |
| 2022/0130800 | A1* | 4/2022 | Duan | H01L 25/0657 |
| 2022/0173037 | A1* | 6/2022 | Huang | H01L 23/5223 |
| 2022/0216154 | A1* | 7/2022 | Liang | H01L 28/40 |
| 2022/0223512 | A1* | 7/2022 | Kuo | H01L 23/49822 |
| 2022/0254740 | A1* | 8/2022 | West | H01L 23/5226 |
| 2022/0254756 | A1* | 8/2022 | Choi | H01L 25/18 |
| 2023/0078884 | A1* | 3/2023 | Duan | H01L 28/60 |
| | | | | 257/532 |

FOREIGN PATENT DOCUMENTS

| | | | | | |
|---|---|---|---|---|---|
| CN | 114582833 | A | * | 6/2022 | H01L 23/5223 |
| CN | 114582833 | A | | 6/2022 | |
| CN | 114725084 | A | | 7/2022 | |
| CN | 114725084 | A | * | 7/2022 | H01L 23/5383 |
| DE | 10 2005 020079 | A1 | | 6/2006 | |
| DE | 102005020079 | A1 | * | 6/2006 | H01L 27/10817 |
| DE | 10 2010 061616 | A1 | | 8/2011 | |
| DE | 102010061616 | A1 | * | 8/2011 | G11C 5/025 |
| DE | 10 2013 113678 | A1 | | 5/2015 | |
| DE | 102013113678 | A1 | * | 5/2015 | H01L 23/5223 |
| DE | 10 2021 117353 | A1 | | 1/2022 | |
| DE | 102021117353 | A1 | * | 1/2022 | H01L 23/3128 |
| DE | 10 2021 122701 | A1 | | 4/2022 | |
| DE | 102021122701 | A1 | * | 4/2022 | H01L 23/5222 |
| DE | 10 2021 131717 | A1 | | 7/2022 | |
| DE | 10 2021 133785 | A1 | | 7/2022 | |
| DE | 102021131717 | A1 | * | 7/2022 | H01L 23/5383 |
| DE | 102021133785 | A1 | * | 7/2022 | H01L 23/481 |
| TW | 202011553 | A | | 3/2020 | |
| TW | 202031106 | A | | 8/2020 | |

\* cited by examiner

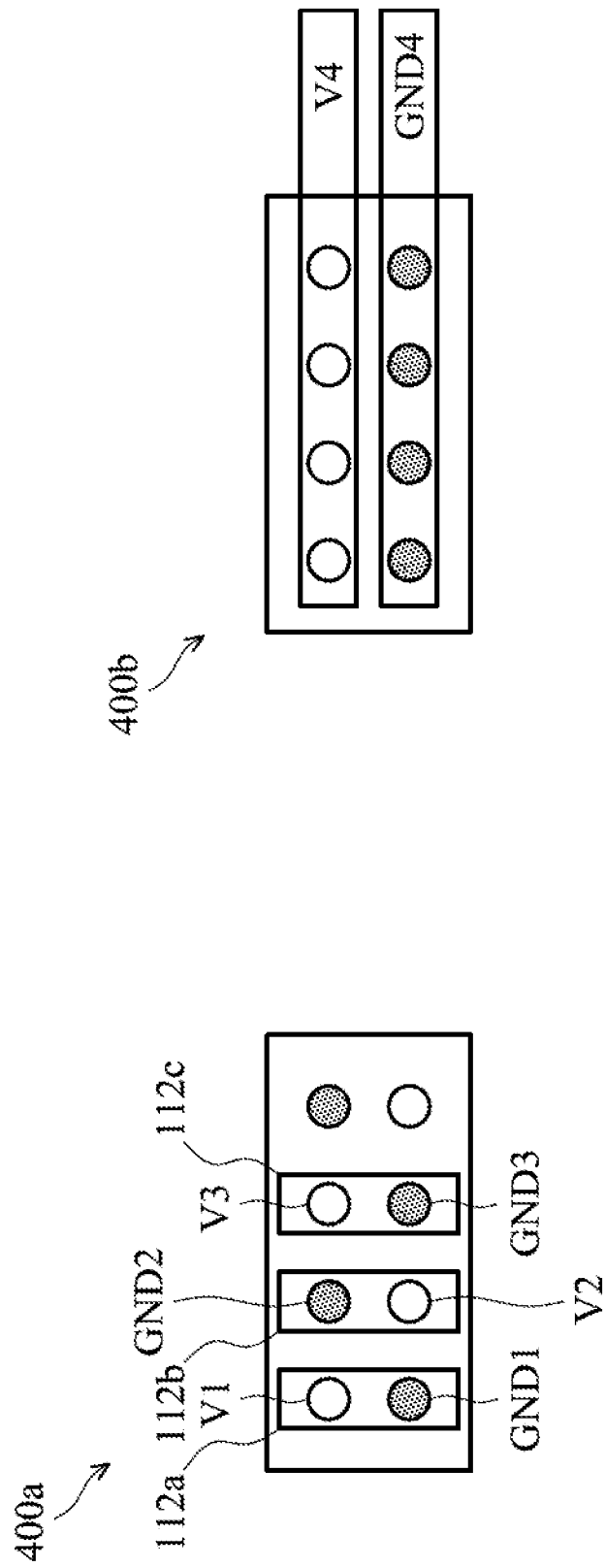

SEMICONDUCTOR STRUCTURE

CROSS REFERENCE TO RELATED APPLICATIONS

This application is a Continuation of U.S. Utility application Ser. No. 17/399,221, filed on Aug. 11, 2021, now U.S. Pat. No. 11,538,793, which claims the benefit of U.S. Provisional Application No. 63/105,922 filed on Oct. 27, 2020, the entireties of which are incorporated by reference herein.

BACKGROUND OF THE INVENTION

Field of the Invention

The present invention is related to semiconductor technology, and in particular to a semiconductor structure that includes a capacitor.

Description of the Related Art

As high performance integrated circuits demand larger currents at higher frequencies with lower power supply voltages, the design of power systems has increasingly become a challenge. Decoupling capacitors may be adopted and act as temporary charge reservoirs to prevent momentary fluctuations in supply voltage. Decoupling capacitor is more and more important to reduce power noise during digital circuit such as a microprocessor including numerous transistors that alternate between on and off states.

Although existing semiconductor structures are generally adequate, they are not satisfactory in every respect. For example, it is challenging to integrate decoupling capacitors since a plurality of capacitors must be used for different power domains. For example, a central processing unit (CPU) may need one decoupling capacitor, and a high performance system-on-chip (SOC) die may need 5 to 10 decoupling capacitors. Therefore, there is a need to further improve semiconductor structures to provide design flexibility.

BRIEF SUMMARY OF THE INVENTION

Semiconductor structures are provided. An exemplary embodiment of a semiconductor structure includes a first substrate comprising a wiring structure, a first semiconductor die disposed on the first substrate, and a multi-terminal capacitor structure disposed on the first substrate. The multi-terminal capacitor comprises a second substrate; an insulating layer disposed over the second substrate; a first multi-terminal capacitor disposed over the insulating layer and electrically coupled to the first semiconductor die through the wiring structure; and a second multi-terminal capacitor disposed over the insulating layer and electrically coupled to the second semiconductor die through the wiring structure, wherein the first multi-terminal capacitor and the second multi-terminal capacitor are electrically isolated from the second substrate.

Another exemplary embodiment is directed to a semiconductor structure comprising: a multi-terminal capacitor structure comprising: an insulating layer; a first multi-terminal capacitor disposed over the insulating layer and comprising a first positive terminal and a first ground terminal; and a second multi-terminal capacitor disposed over the insulating layer and comprising a second positive terminal and a second ground terminal, wherein the second multi-terminal capacitor is electrically isolated from the first multi-terminal capacitor; and a package structure disposed over the multi-terminal multi-capacitor structure and comprising a first semiconductor die electrically coupled to the first multi-terminal capacitor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 4A and 4B are top views of a multi-terminal multi-capacitor structure of an exemplary semiconductor structure in accordance with some embodiments;

DETAILED DESCRIPTION OF THE INVENTION

Figure 2:
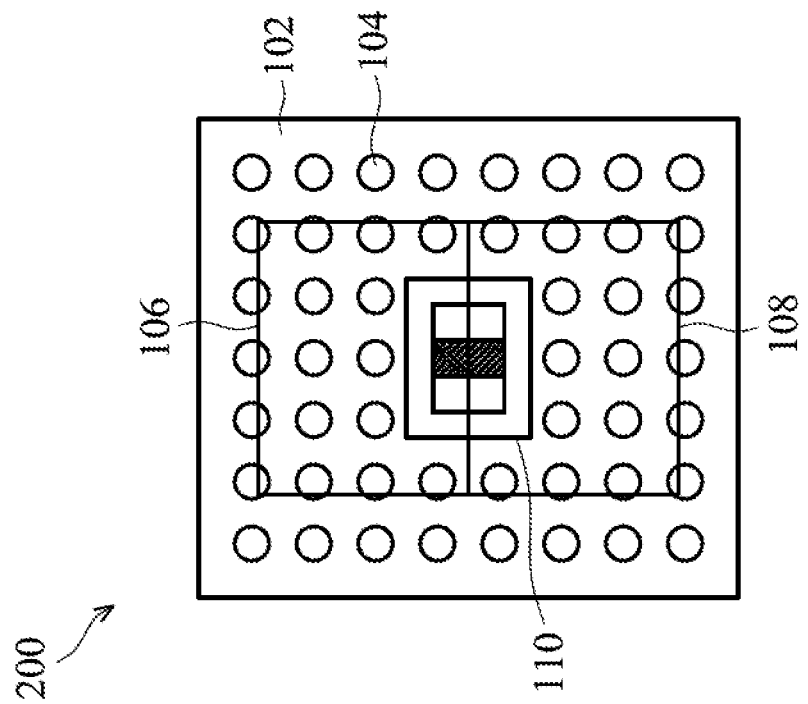
FIG. 2 is a top view of an exemplary semiconductor structures in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

A semiconductor structure is described in accordance with some embodiments of the present disclosure. The semiconductor structure includes a multi-terminal multi-capacitor structure, which has more than one capacitor with more than one terminals, so that the occupied area can be reduced and the design flexibility can be elevated.

Figure 1:
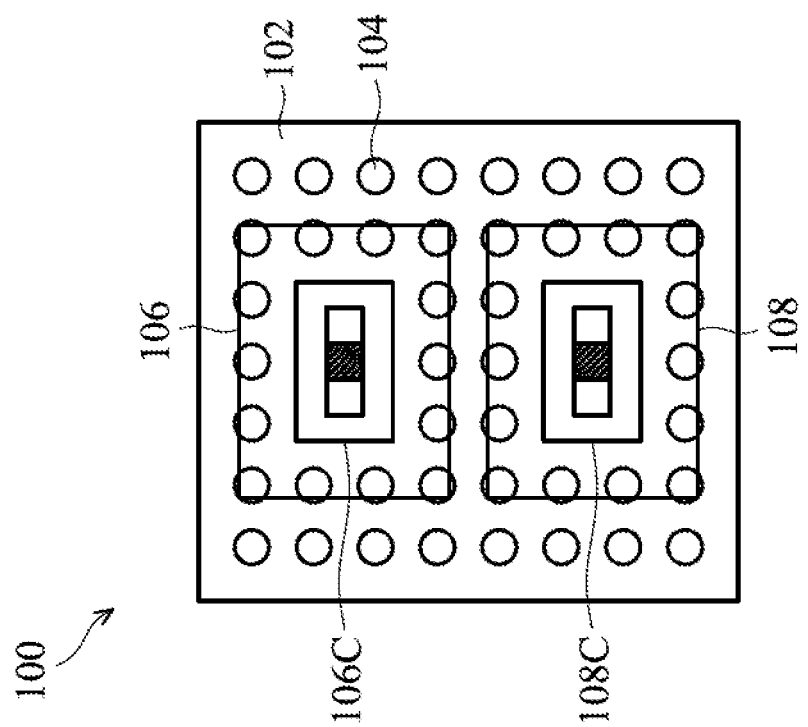
FIG. 1 is a top view of an exemplary semiconductor structure in accordance with some embodiments.

FIG. 1 is a top view of a semiconductor structure 100 in accordance with some embodiments of the disclosure. Additional features can be added to the semiconductor structure 100. Some of the features described below can be replaced or eliminated for different embodiments. To simplify the diagram, only a portion of the semiconductor structure 100 is illustrated.

As shown in FIG. 1, the semiconductor structure 100 includes a substrate 102, in accordance with some embodiments. There may be a wiring structure inside the substrate 102. In some embodiments, the wiring structure in the substrate 102 includes conductive layers, conductive vias, conductive pillars, the like, or a combination thereof. The wiring structure in the substrate 102 may be formed of metal, such as copper, aluminum, or a combination thereof.

The wiring structure in the substrate 102 may be disposed in inter-metal dielectric (IMD) layers. In some embodiments, the IMD layers are formed of organic materials, such as a polymer base material, non-organic materials, such as silicon nitride, silicon oxide, silicon oxynitride, or a combination thereof. The substrate 102 may have a first surface and a second surface which is opposite the first surface. It should be noted that the configuration of the substrate 102 shown in the figures is exemplary only and is not intended to limit the present invention. Any desired semiconductor element may be formed in and on the substrate 102. However, in order to simplify the diagram, only the flat substrate 102 is illustrated.

As shown in FIG. 1, the semiconductor structure 100 includes a plurality of conductive structures 104, in accordance with some embodiments. The conductive structures 104 may be disposed on the first surface of the substrate 102 and may be electrically coupled to the wiring structure of the substrate 102. In some embodiments, the conductive structures 104 include conductive materials, such as metal. The conductive structures 104 may be microbumps, controlled collapse chip connection (C4) bumps, ball grid array (BGA) balls, the like, or a combination thereof.

The semiconductor structure 100 includes a first semiconductor die 106 and a second semiconductor die 108, in accordance with some embodiments. The first semiconductor die 106 and the second semiconductor die 108 may be disposed on the second surface of the substrate 102, and shown for illustrative purposes only. The first semiconductor die 106 and the second semiconductor die 108 may be electrically coupled to the wiring structure of the substrate 102.

According to some embodiments, the first semiconductor die 106 and the second semiconductor die 108 each independently includes a system-on-chip (SoC) die, a logic device, a memory device, a radio frequency (RF) device, the like, or a combination thereof. For example, the first semiconductor die 106 and the second semiconductor die 108 may each independently include a micro control unit (MCU) die, a microprocessor unit (MPU) die, a power management integrated circuit (PMIC) die, a global positioning system (GPS) device, a central processing unit (CPU) die, a graphics processing unit (GPU) die, an input-output (IO) die, a dynamic random access memory (DRAM) controller, a static random-access memory (SRAM), a high bandwidth memory (HBM), or a combination thereof.

The semiconductor structure 100 includes a first capacitor 106C and a second capacitor 108C disposed on the second surface of the substrate 102, in accordance with some embodiments. The first capacitor 106C may be electrically coupled to the first semiconductor die 106 through the wiring structure of the substrate 102, and the second capacitor 108C may be electrically coupled to the second semiconductor die 108 through the wiring structure of the substrate 102. The first capacitor 106C and the second capacitor 108C may be provided to reduce system current-resistance (IR) drop.

The first capacitor 106C and the second capacitor 108C each occupies spaces. As shown in FIG. 1, the first capacitor 106C and the second capacitor 108C each occupies the area of six pieces of the conductive structures 104, for example. This is challenging to integrate different capacitors for different semiconductor components as the increasing demand for more functions and smaller devices. Therefore, the present disclosure provides another embodiment to solve the above problem.

FIG. 2 is a top view of a semiconductor structure 200, in accordance with some other embodiments of the disclosure. It should be noted that the semiconductor structure 200 may include the same or similar components as that of the semiconductor structure 100, which is illustrated in FIG. 1, and for the sake of simplicity, those components will not be discussed in detail again. In comparison with the embodiment of FIG. 1 where the semiconductor structure 100 includes a plurality of capacitors, the following embodiments will replace these capacitors with a multi-terminal multi-capacitor structure to reduce the space occupied.

As shown in FIG. 2, the semiconductor structure 200 includes a multi-terminal multi-capacitor structure 110, in accordance with some embodiments. The multi-terminal multi-capacitor structure 110 may occupy the area of six pieces of the conductive structures 104, for example. That is, different power domains can share one multi-terminal multi-capacitor structure 110. Thus no need to use separate capacitors for each different voltage design. As a result, occupied area can be reduced, more conductive structures 104 can be remained, and design flexibility can be provided.

The multi-terminal multi-capacitor structure 110 may include a capacitor for the first semiconductor die 106 and a capacitor for the second semiconductor die 108 arranged side-by-side. The first semiconductor die 106 and the second semiconductor die 108 may also be arranged side-by-side. The sidewall of the first semiconductor die 106 may be aligned with the sidewall of the second semiconductor die 108. However, the present disclosure is not limit thereto. For example, the first semiconductor die 106 and the second semiconductor die 108 may be stacked vertically.

In some embodiments, the multi-terminal multi-capacitor structure 110 partially overlaps both the first semiconductor die 106 and the second semiconductor die 108 in a direction that is substantially vertical to the first surface of the substrate 102, as shown in FIG. 2. Alternatively, the multi-terminal multi-capacitor structure 110 may partially overlap the first semiconductor die 106 or the second semiconductor die 108 in a direction that is substantially vertical to the first surface of the substrate 102.

As shown in FIG. 2, the multi-terminal multi-capacitor structure 110 may be surrounded by the conductive structures 104. The numbers of the conductive structures 104 adjacent to the multi-terminal multi-capacitor structure 110 may be same or different on each side of the multi-terminal multi-capacitor structure 110. The numbers and configurations of the multi-terminal multi-capacitor structure 110 and the conductive structures 104 are shown for illustrative purposes only.

As shown in FIG. 2, two semiconductor dies, the first semiconductor die 106 and the second semiconductor die 108, share one multi-terminal multi-capacitor structure 110, but the present disclosure is not limit thereto. For example, more than two semiconductor dies may share and partially overlap the multi-terminal multi-capacitor structure 110 in a direction that is substantially vertical to the first surface of the substrate 102. Alternatively, more than one multi-terminal multi-capacitor structures may be utilized for a plurality of semiconductor dies. According to some embodiments, the semiconductor structure 200 also include one or more passive components (not illustrated), such as resistors, capacitors, inductors, or a combination thereof.

Figure 3:
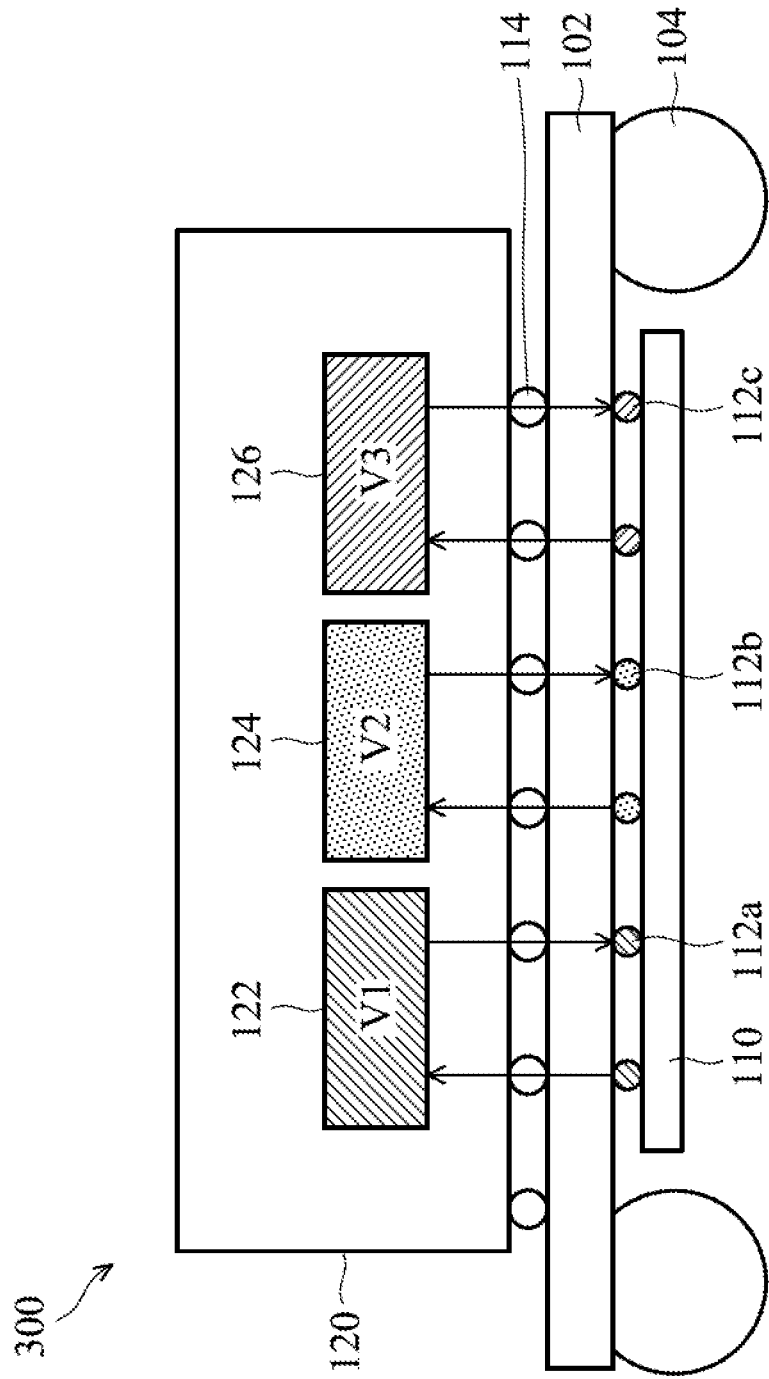
FIG. 3 is a cross-sectional view of an exemplary semiconductor structure in accordance with some embodiments.

FIG. 3 is a cross-sectional view of a semiconductor structure 300, in accordance with some embodiments of the disclosure. It should be noted that the semiconductor structure 300 may include the same or similar components as that of the semiconductor structure 200, which is illustrated in FIG. 2, and for the sake of simplicity, those components will not be discussed in detail again. In the following embodiments, three semiconductor dies share a multi-terminal multi-capacitor structure.

As shown in FIG. 3, the semiconductor structure 300 includes a first semiconductor die 122, a second semiconductor die 124, and a third semiconductor die 126, which have a first voltage domain V1, a second voltage domain V2, and a third voltage domain V3, respectively, in accordance with some embodiments. In some embodiments, the first semiconductor die 122, the second semiconductor die 124, and the third semiconductor die 126 may be included in a package structure 120. In some other embodiments, the first semiconductor die 122, the second semiconductor die 124, and the third semiconductor die 126 may be separate.

The first semiconductor die 122, the second semiconductor die 124, and the third semiconductor die 126 may include similar or different components. The first semiconductor die 122, the second semiconductor die 124, and the third semiconductor die 126 may be similar to the first semiconductor die 106 and/or the second semiconductor die 108 as shown in FIG. 2, and will not be repeated. According to some embodiments, the package structure 120 also include one or more passive components (not illustrated), such as resistors, capacitors, inductors, or a combination thereof.

As shown in FIG. 3, the semiconductor structure 300 includes a plurality of conductive structures 114 between the package structure 120 and the substrate 102, in accordance with some embodiments. The first semiconductor die 122, the second semiconductor die 124, and the third semiconductor die 126 may be electrically coupled to the wiring structure of the substrate 102 through the conductive structures 114. In some embodiments, the conductive structures 114 include conductive materials, such as metal. The conductive structures 114 may be microbumps, controlled collapse chip connection (C4) bumps, ball grid array (BGA) balls, the like, or a combination thereof. The conductive structures 114 may be similar to or different from the conductive structures 104.

As shown in FIG. 3, the semiconductor structure 300 includes the multi-terminal multi-capacitor structure 110, in accordance with some embodiments. The multi-terminal multi-capacitor structure 110 may include a plurality of multi-terminal capacitors (not shown) for the first semiconductor die 122, the second semiconductor die 124, and the third semiconductor die 126, which may be referred to a first multi-terminal capacitor, a second multi-terminal capacitor, and a third multi-terminal capacitor, respectively.

In some embodiments, the first multi-terminal capacitor, the second multi-terminal capacitor, and the third multi-terminal capacitor include first terminals 112a, second terminals 112b, and third terminals 112c, respectively. Each of the first terminals 112a, the second terminals 112b, and the third terminals 112c include a positive terminal and a ground terminal, which reduces the equivalent series resistor (ESR) and equivalent series inductance (ESL) to reduce the system IR drop.

The first semiconductor die 122 may be electrically coupled to the first multi-terminal capacitor through the first terminals 112a, the wiring structure of the substrate 102, and the conductive structures 114. The second semiconductor die 124 may be electrically coupled to the second multi-terminal capacitor through the second terminals 112b, the wiring structure of the substrate 102, and the conductive structures 114. The third semiconductor die 126 may be electrically coupled to the third multi-terminal capacitor through the third terminals 112c, the wiring structure of the substrate 102, and the conductive structures 114.

As shown in FIG. 3, the multi-terminal multi-capacitor structure 110 is a land-side capacitor (LSC), in accordance with some embodiments. In particular, the multi-terminal multi-capacitor structure 110 and the semiconductor dies 122, 124, 126 (or the package structure 120) may be disposed on opposite sides of the substrate 102. The multi-terminal multi-capacitor structure 110 and the conductive structures 104 may be disposed on the same side of the substrate 102. The semiconductor dies 122, 124, 126 (or the package structure 120) may partially overlap the multi-terminal multi-capacitor structure 110 and the conductive structures 104.

Alternatively, the multi-terminal multi-capacitor structure 110 may be a die-side capacitor (DSC) (not shown), in accordance with some other embodiments. In particular, the multi-terminal multi-capacitor structure 110 and the semiconductor dies 122, 124, 126 (or the package structure 120) may be disposed on the same side of the substrate 102. The multi-terminal multi-capacitor structure 110 and the conductive structures 104 may be disposed on opposite sides of the substrate 102. The multi-terminal multi-capacitor structure 110 may be adjacent to one or more of the semiconductor dies 122, 124, 126 (or the package structure 120). The semiconductor dies 122, 124, 126 (or the package structure 120) and the multi-terminal multi-capacitor structure 110 may partially overlap the conductive structures 104.

As shown in FIG. 3, the first semiconductor die 122, the second semiconductor die 124, and the third semiconductor die 126 are disposed in a row, which is shown for illustrative purposes only. For example, the first semiconductor die 122, the second semiconductor die 124, and the third semiconductor die 126 may be stacked vertically. Similarly, the first terminals 112a, the second terminals 112b, and the third terminals 112c disposed in a row are shown for illustrative purposes only. Some exemplary configurations are described in the following.

FIG. 4A is a top view of a multi-terminal multi-capacitor structure 400a in accordance with some embodiments. It should be noted that the multi-terminal multi-capacitor structure 400a may include the same or similar components as that of the multi-terminal multi-capacitor structure 110 of the semiconductor structure 300, which is illustrated in FIG. 3, and for the sake of simplicity, those components will not be discussed in detail again.

In some embodiments, the first terminals 112a include a first positive terminal V1 and a first ground terminal GND1, the second terminals 112b include a second positive terminal V2 and a second ground terminal GND2, and the third terminals 112c include a third positive terminal V3 and a third ground terminal GND3. The multi-terminal multi-capacitor structure 110 also include some other terminals which are shown for illustrative purpose only. Adjacent two of the terminals 112a, 112b, 112c may be arranged side-by-side. Adjacent two of the multi-terminal capacitors including the terminals 112a, 112b, 112c may also be arranged side-by-side.

As shown in FIG. 4A, the first positive terminal V1, the second ground terminal GND2, and the third positive terminal V3 may be disposed along a first line, and the first ground terminal GND1, the second positive terminal V2, and the third ground terminal GND3 may be disposed along a second line. The first line may be substantially parallel to the second line.

Figure 5B:
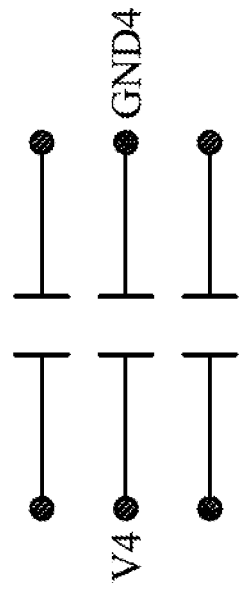
FIGS. 5A, 5B, and 5C are conceptual diagrams of a multi-terminal multi-capacitor structure of an exemplary semiconductor structure in accordance with some embodiments.
Figure 5A:
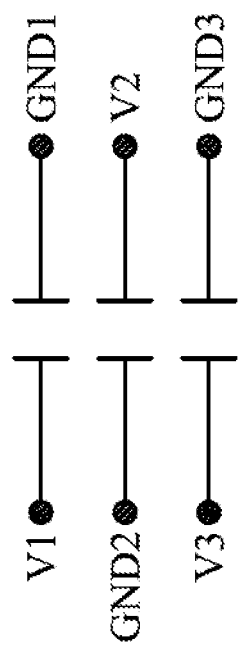

A conceptual diagram of the multi-terminal multi-capacitor structure 400a is illustrated in FIG. 5A, in accordance with some embodiments. The first multi-terminal capacitor (including the first positive terminal V1 and the first ground terminal GND1), the second multi-terminal capacitor (including the second positive terminal V2 and the second ground terminal GND2), and the third multi-terminal capacitor (including the third positive terminal V3 and the third ground terminal GND3) may be separate. In particular, the first multi-terminal capacitor, the second multi-terminal capacitor, and the third multi-terminal capacitor may be electrically isolated from each other.

FIG. 4B is a top view of a multi-terminal multi-capacitor structure 400b in accordance with some embodiments. It should be noted that the multi-terminal multi-capacitor structure 400b may include the same or similar components as that of the multi-terminal multi-capacitor structure 400a, which is illustrated in FIG. 4B, and for the sake of simplicity, those components will not be discussed in detail again.

In some embodiments, a first positive terminal, a second positive terminal, a third positive terminal, and a fourth positive terminal are equal, which may be referred to as V4. In some embodiments, a first ground terminal, a second ground terminal, a third ground terminal, and a fourth ground terminal are equal, which may be referred to as GND4. Adjacent two of the terminals may be arranged side-by-side. Adjacent two of the multi-terminal capacitors including these terminals may also be arranged side-by-side.

As shown in FIG. 4B, the first positive terminal, the second positive terminal, the third positive terminal, and the fourth positive terminal V4 may be disposed along a first line, and the first ground terminal, the second ground terminal, the third ground terminal, and the fourth ground terminal GND4 may be disposed along a second line. The first line may be substantially parallel to the second line.

A conceptual diagram of six of the terminals of the multi-terminal multi-capacitor structure 400b is illustrated in FIG. 5B, in accordance with some embodiments. The first positive terminal, the second positive terminal, and the third positive terminal V4 may be electrically coupled to each other. The first ground terminal, the second ground terminal, and the third ground terminal GND4 may be electrically coupled to each other. That is, the first multi-terminal capacitor, the second multi-terminal capacitor, and the third multi-terminal capacitor may be electrically coupled to each other.

Figure 5C:
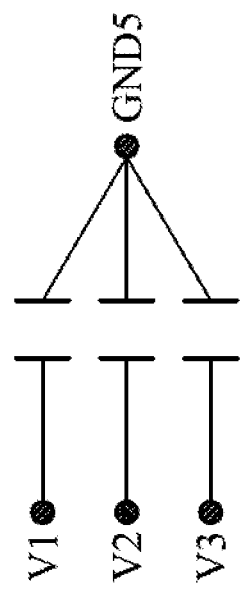

FIG. 5C is a conceptual diagram of a multi-terminal multi-capacitor structure in accordance with some embodiments. In some embodiments, the first terminals include a first positive terminal V1 and a first ground terminal, the second terminals include a second positive terminal V2 and a second ground terminal, and the third terminals include a third positive terminal V3 and a third ground terminal. The first ground terminal, the second ground terminal, and the third ground terminal may be electrically coupled to a common ground GND5.

Figure 6:
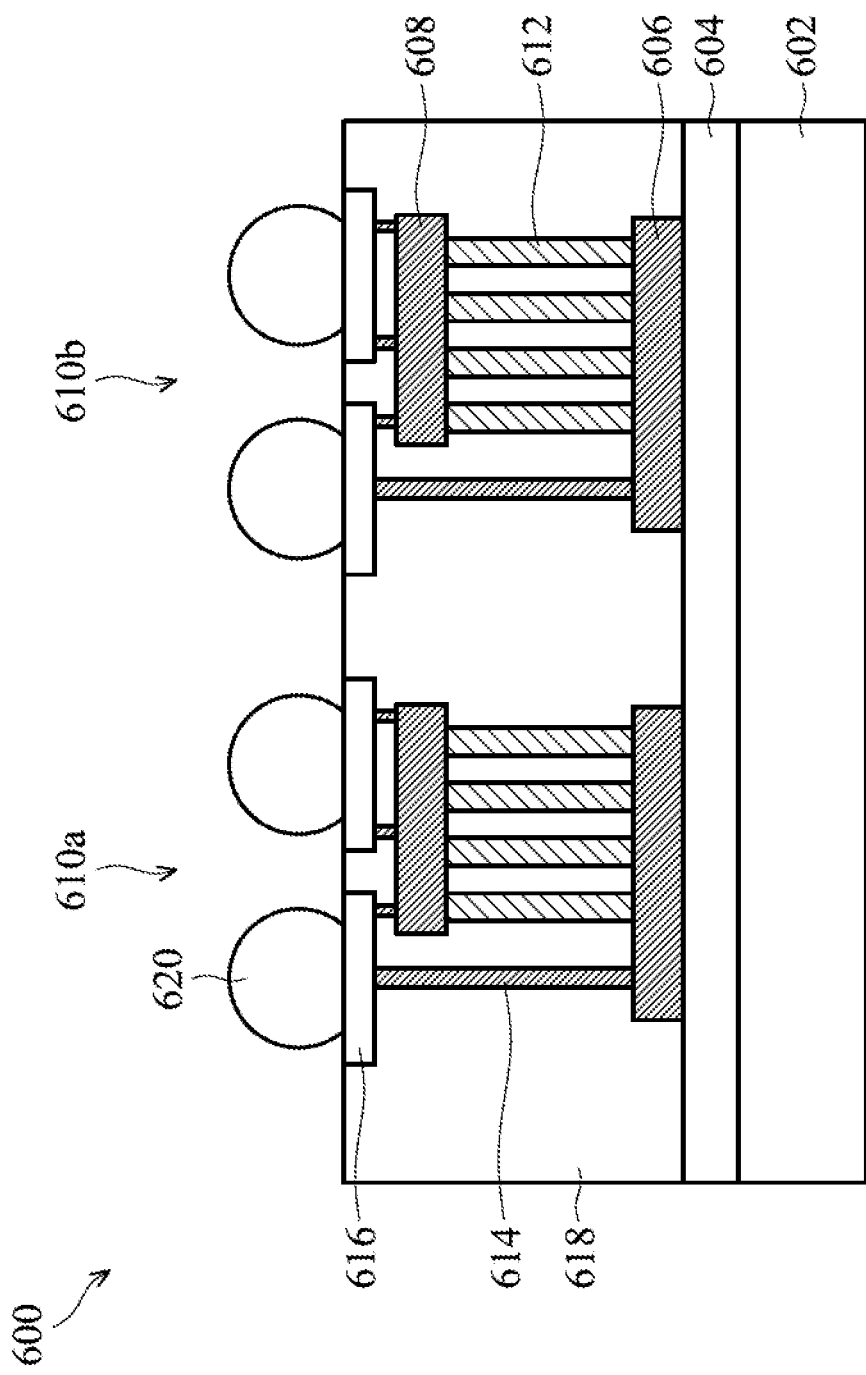
FIG. 6 is a cross-sectional view of a multi-terminal multi-capacitor structure of an exemplary semiconductor structure in accordance with some embodiments.

FIG. 6 is a cross-sectional view of a multi-terminal multi-capacitor structure 600 of a semiconductor structure in accordance with some embodiments. It should be noted that the multi-terminal multi-capacitor structure 600 may include the same or similar components as that of the multi-terminal multi-capacitor structure 110, which is illustrated in FIG. 3, and for the sake of simplicity, those components will not be discussed in detail again.

As shown in FIG. 6, the multi-terminal multi-capacitor structure 600 includes a semiconductor substrate 602 in accordance with some embodiments. The semiconductor substrate 602 may be formed of silicon, silicon germanium, germanium, other suitable semiconductor, or a combination thereof. It should be noted that the configuration of the semiconductor substrate 602 shown in the figures is exemplary only and is not intended to limit the present invention. Any desired semiconductor element may be formed in and on the semiconductor substrate 602. However, in order to simplify the diagram, only the flat semiconductor substrate 602 is illustrated.

As shown in FIG. 6, the multi-terminal multi-capacitor structure 600 includes an insulating layer 604 disposed over the semiconductor substrate 602 in accordance with some embodiments. The insulating layer 604 may cover the top surface of the semiconductor substrate 602. The insulating layer 604 may be formed of silicon oxide, silicon nitride, silicon oxynitride, other suitable isolation material, or a combination thereof.

As shown in FIG. 6, the multi-terminal multi-capacitor structure 600 includes a first multi-terminal capacitor 610a and a second multi-terminal capacitor 610b disposed over the insulating layer 604. The insulating layer 604 may electrically isolate the first multi-terminal capacitor 610a and the second multi-terminal capacitor 610b from the substrate 102. As a result, a plurality of multi-terminal capacitors can be grouped to form one capacitor (i.e., the multi-terminal multi-capacitor structure 600) which provides decoupling capacitor function to different voltage domains, thereby reducing the occupied space of the capacitor. In addition, design flexibility can be improved, and performance boost can also be provided.

As shown in FIG. 6, each of the first multi-terminal capacitor 610a and the second multi-terminal capacitor 610b includes conductive layers 606, 608, 616 in accordance with some embodiments. The conductive layers 606, 608, 616 may be formed of metal, such as tungsten. Each of the first multi-terminal capacitor 610a and the second multi-terminal capacitor 610b includes capacitor cells 612 between the conductive layers 606 and 608, and includes a plurality of vias 614 between the conductive layers 606 and 616 and between conductive layers 608 and 616 in accordance with some embodiments. The vias 614 may be formed of metal, such as copper.

As shown in FIG. 6, the multi-terminal multi-capacitor structure 600 includes a dielectric layer 618 disposed over the insulating layer 604 and surrounds the first multi-terminal capacitor 610a and the second multi-terminal capacitor 610b in accordance with some embodiments. The dielectric layer 618 may be formed of organic materials, such as a polymer base material, non-organic materials, such as silicon nitride, silicon oxide, silicon oxynitride, or a combination thereof.

As shown in FIG. 6, the multi-terminal multi-capacitor structure 600 includes a plurality of terminals 620 disposed over the conductive layers 616 in accordance with some embodiments. The terminals 620 may be exposed by the dielectric layer 618. The terminals 620 may be formed of conductive materials, such as metal.

The terminals 620 of the first multi-terminal capacitor 610a may include a positive terminal and a ground terminal and may be electrically coupled to a semiconductor die (such as the first semiconductor die 122 as shown in FIG. 3). The terminals 620 of the second multi-terminal capacitor 610b may include a positive terminal and a ground terminal and may be electrically coupled to another semiconductor die (such as the second semiconductor die 124 as shown in FIG. 3).

In summary, in comparison with using separate capacitors for different voltage domains of different semiconductors, the present disclosure adopts a multi-terminal multi-capacitor structure which includes a plurality of capacitors and a plurality of terminals. The terminals include a positive terminal and a ground terminal. Therefore, the space occupied by the capacitor can be reduced, and the conductive structures remain on the substrate can be increased. As a result, design flexibility can be increased, and design can be easier. Performance boost can also be provided. In addition, the equivalent series resistor (ESR) and equivalent series inductance (ESL) can be reduced, thereby lowering the system IR drop.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a first substrate comprising a wiring structure;
   a first semiconductor die disposed on the first substrate; and
   a multi-terminal capacitor structure disposed on the first substrate and comprising:
      a second substrate;
      an insulating layer disposed over the second substrate;
      a first multi-terminal capacitor disposed over the insulating layer and electrically coupled to the first semiconductor die through the wiring structure; and
      a second multi-terminal capacitor disposed over the insulating layer and electrically coupled to a second semiconductor die through the wiring structure, wherein the first multi-terminal capacitor and the second multi-terminal capacitor are electrically isolated from the second substrate.

2. The semiconductor structure as claimed in claim 1, wherein the first semiconductor die is disposed over a first surface of the first substrate, and the multi-terminal capacitor structure is disposed over a second surface of the first substrate which is opposite the first surface of the first substrate.

3. The semiconductor structure as claimed in claim 2, further comprising a plurality of conductive structures disposed over the second surface of the first substrate and adjacent to the multi-terminal capacitor structure.

4. The semiconductor structure as claimed in claim 1, further comprising a plurality of conductive structures disposed over a first surface of the first substrate, wherein the first semiconductor die and the multi-terminal capacitor structure are disposed over a second surface of the first substrate which is opposite the first surface of the first substrate.

5. The semiconductor structure as claimed in claim 1, wherein the first multi-terminal capacitor comprises a first positive terminal and a first ground terminal, and the second multi-terminal capacitor comprises a second positive terminal and a second ground terminal,
   wherein the first positive terminal, the first ground terminal, the second positive terminal, and the second ground terminal are disposed between the first substrate and the second substrate.

6. The semiconductor structure as claimed in claim 5, wherein the first positive terminal and the second positive terminal are disposed along a first line, and the first ground terminal and the second ground terminal are disposed along a second line, wherein the first line is substantially parallel to the second line.

7. The semiconductor structure as claimed in claim 5, wherein the first positive terminal and the second ground terminal are disposed along a first line, and the first ground terminal and the second positive terminal are disposed along a second line, wherein the first line is substantially parallel to the second line.

8. The semiconductor structure as claimed in claim 5, wherein the first ground terminal and the second ground terminal are electrically coupled to a common ground.

9. The semiconductor structure as claimed in claim 5, wherein the first ground terminal is electrically coupled to the second ground terminal.

10. The semiconductor structure as claimed in claim 9, wherein the first positive terminal is electrically coupled to the second positive terminal.

11. A semiconductor structure, comprising:
   a multi-terminal capacitor structure comprising:
      an insulating layer;
      a first multi-terminal capacitor disposed over the insulating layer and comprising a first positive terminal and a first ground terminal; and
      a second multi-terminal capacitor disposed over the insulating layer and comprising a second positive terminal and a second ground terminal, wherein the second multi-terminal capacitor is electrically isolated from the first multi-terminal capacitor; and
   a package structure disposed over the multi-terminal multi-capacitor structure and comprising:
      a first semiconductor die electrically coupled to the first multi-terminal capacitor.

12. The semiconductor structure as claimed in claim 11, further comprising a plurality of conductive structures adjacent to the multi-terminal capacitor structure, wherein the package structure partially overlaps the multi-terminal capacitor structure and the plurality of conductive structures.

13. The semiconductor structure as claimed in claim 11, wherein the multi-terminal capacitor structure further comprises a third multi-terminal capacitor disposed over the insulating layer,
   wherein the third multi-terminal capacitor comprises a third positive terminal and a third ground terminal, and the first multi-terminal capacitor, the second multi-terminal capacitor, and the third multi-terminal capacitor are electrically isolated from each other.

14. The semiconductor structure as claimed in claim 13, wherein the first positive terminal, the second positive terminal, and the third positive terminal are disposed along a first line, and the first ground terminal, the second ground terminal, and the third ground terminal are disposed along a second line.

15. The semiconductor structure as claimed in claim 13, wherein the first positive terminal, the second ground terminal, and the third positive terminal are disposed along a first line, and the first ground terminal, the second positive terminal, and the third ground terminal are disposed along a second line.

16. The semiconductor structure as claimed in claim 13, wherein the package structure further comprises a third semiconductor die electrically coupled to the third multi-terminal capacitor.

17. The semiconductor structure as claimed in claim 13, wherein two of the first multi-terminal capacitor, the second multi-terminal capacitor, and the third multi-terminal capacitor are arranged side-by-side.

18. The semiconductor structure as claimed in claim 13, wherein the first positive terminal, the first ground terminal, the second positive terminal, the second ground terminal, the third positive terminal, and the third ground terminal are disposed between the package structure and the insulating layer.

19. The semiconductor structure as claimed in claim 11, further comprising a substrate disposed between the package structure and the multi-terminal capacitor structure and having a wiring structure, wherein the wiring structure electrically couples the package structure to the multi-terminal capacitor structure.

20. The semiconductor structure as claimed in claim 19, further comprising a plurality of conductive structures disposed between the package structure and the substrate and electrically coupling the package structure to the wiring structure.

\* \* \* \* \*